(12) United States Patent
Choi et al.

(10) Patent No.: US 8,471,739 B2
(45) Date of Patent: Jun. 25, 2013

(54) DIGITAL ANALOG CONVERTER AND METHOD FOR CALIBRATING SOURCES THEREOF

(75) Inventors: Jang Hong Choi, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 27 days.

(21) Appl. No.: 13/312,449

(22) Filed: Dec. 6, 2011

(65) Prior Publication Data

US 2012/0161993 A1    Jun. 28, 2012

(30) Foreign Application Priority Data

Dec. 23, 2010   (KR) ......................... 10-2010-0134050

(51) Int. Cl.
*H03M 1/10*         (2006.01)
(52) U.S. Cl.
USPC .......................................... 341/120; 341/144

(58) Field of Classification Search
USPC ................. 341/120, 118, 144, 154, 145, 136, 341/131, 153
See application file for complete search history.

(56) References Cited

U.S. PATENT DOCUMENTS 5,703,586 A * 12/1997 Tucholski ..................... 341/144
2010/0164765 A1   7/2010 Miyahara et al.

OTHER PUBLICATIONS

Tao Chen, "A 14-bit 200-MHz Current-Steering DAC With Switching-Sequence Post-Adjustment Calibration", IEEE Journal of Solid-State Circuits, Nov. 2007, pp. 2386-2394, vol. 42 No. 11, IEEE.

* cited by examiner

*Primary Examiner* — Joseph Lauture

(57) ABSTRACT

Provided is a digital analog converter that output currents having different magnitudes for a digital input value according to a mapping table. The digital analog converter includes: a plurality of current sources; and a calibration unit configured to sort index values for identifying the plurality of current sources according to current magnitudes of the current sources, couple each two current sources which are symmetrical left and right about the center of the sorted index values, and map the current source pairs into a mapping table.

8 Claims, 5 Drawing Sheets

DIGITAL ANALOG CONVERTER AND METHOD FOR CALIBRATING SOURCES THEREOF

CROSS-REFERENCES TO RELATED APPLICATIONS

The present application claims priority to Korean application number 10-2010-0134050, filed on Dec. 23, 2010, which is incorporated by reference in its entirety.

BACKGROUND

The present invention relates to a digital analog converter and a method for calibrating current sources thereof, and more particularly, to a digital analog converter, which is capable of preventing performance degradation caused by abnormal characteristics of analog circuits in a digital analog converter using a current source due to imperfections of a semiconductor process and nonideal characteristics of a semiconductor element, and a method for calibrating current sources thereof.

A digital analog converter includes a plurality of current sources, and may receive a digital input value from outside and control a current flow by discharging current from a part or all of the current sources according to the digital input value.

For example, it may be assumed that the digital analog converter includes N current sources. In this case, when the digital input value is 3, the digital analog converter may control three current sources to discharge currents, and may prevent the other current sources from discharging currents. In this way, the digital analog converter may control a current switch to convert digital data into an analog signal.

The currents of the plurality of current sources included in the digital analog converter may have different magnitudes from each other and an error with respect to the magnitude of a reference current, because of imperfections of a semiconductor process and nonideal characteristics of a semiconductor element. The mismatching between the respective current sources may degrade integral nonlinearity (INL) and differential nonlinearity (DNL) which indicate the performance of the digital analog converter.

In order to solve such a problem, a variety of attempts to match the current values of the respective current sources as much as possible by using calibration have been made.

Among the attempts, a representative method is to compare the current values of the respective current sources with a reference current value and calibrate the current values of the current sources to the reference current value through an auxiliary digital analog converter by using errors therebetween in a negative feedback circuit. When the current values of the respective current sources are calibrated to the reference current value, all the current sources are equalized to the reference current value to thereby improve the performance of the digital analog converter. However, the area of an integrated circuit is inevitably increased due to the auxiliary digital analog converter. Furthermore, since the auxiliary digital analog converter and the negative feedback circuit are implemented as analog circuits, the performance of the digital analog converter may be degraded by abnormal characteristics of the analog circuits.

FIG. 1 is a block diagram of a general digital analog converter. FIG. 2 is a graph showing current magnitudes based on imperfections of a semiconductor process and nonideal characteristics of a semiconductor element.

FIG. 1 illustrates a 4-bit current digital analog converter as a digital analog converter with no calibration function.

Digital data inputted from outside may turn on/off a current switch to control a current flow. For example, when the value of the digital data is 3, three switches may be turned on, and the other switches may be turned off. Then, a current flowing in a resistance load becomes three times larger than a current Iu, and a voltage VDD drops by 3*Iu*R.

Therefore, the digital analog converter may convert digital data into an analog signal by controlling the current switches in such a manner.

In such a digital analog converter, the current magnitudes of the respective current sources are different from each other as shown in FIG. 2, because of imperfections of a semiconductor process and nonideal characteristics of a semiconductor element. Furthermore, the current magnitudes have an error with respect to the average value and exhibits a Gaussian distribution. The mismatching between the respective current sources may degrade INL and DNL which indicate the performance of the digital analog converter.

Therefore, the auxiliary digital analog converter has been added to calibrate the current sources of the digital analog converter. In this case, however, the area of the integrated circuit is inevitably increased, and the performance thereof may be degraded by nonideal characteristics of the analog circuits.

SUMMARY

Embodiments of the present invention are directed to a digital analog converter capable of improving a mismatching characteristic between current sources of the digital analog converter using the current sources due to imperfections of a semiconductor process and a semiconductor property, and a method for calibrating current sources thereof.

In one embodiment, there is provided a digital analog converter that output currents having different magnitudes for a digital input value according to a mapping table. The digital analog converter includes: a plurality of current sources; and a calibration unit configured to sort index values for identifying the plurality of current sources according to current magnitudes of the current sources, couple each two current sources which are symmetrical left and right about the center of the sorted index values, and map the current source pairs into a mapping table.

The calibration unit may include: a current comparator configured to compare the current magnitudes of the plurality of current sources; a group sorting register configured to store addresses of a plurality of sorted groups; a unit sorting register configured to store address of a plurality of current sources sorted in each of the groups; an ungroup register configured to receive addresses from the group sorting register and the unit sorting register, ungroup the grouped addresses according to the current magnitudes of the current sources, and store the ungrouped addresses; a RAM data generator configured to generate a mapping table for mapping the plurality of current sources onto digital input values; a mapping memory configured to store the mapping table; a comparison signal generator configured to generate a control signal for selecting current sources which are to be compared when the plurality of current sources are compared; and a sorting controller configured to receive an output of the current comparator, sort the addresses of the current sources according to the current magnitudes of the current sources, store the sorting result in the group sorting register, the unit sorting register, and the ungroup register, and control the comparison signal generator to store the mapping table in the mapping memory.

The digital analog converter may further include a multiplexer configured to select one of a calibration mode for selecting an operation of the calibration unit and a DAC mode for outputting a current for the digital input value according to the mapping table.

In another embodiment, a method for calibrating current sources of a digital analog converter includes: sorting index values for identifying a plurality of current sources according to current magnitudes of the current sources; and coupling two current sources which are symmetrical left and right about the center of the sorted index values, and mapping the current source pairs into a mapping table.

In the step of sorting the index values, the index values may be sorted in a descending or ascending order according to the current magnitudes of the current sources.

The step of sorting the index values may include: dividing the plurality of current sources into a plurality of groups, and sorting the plurality of groups according to the sum of current magnitudes of current sources included in each of the groups; sorting the plurality of current sources included in each of the groups according to the current magnitudes of the current sources; and alternately and sequentially arranging the plurality of sorted groups and the sorted current sources in the respective groups according to a sorting order.

In the step of sorting the plurality of groups and the step of sorting the plurality of current sources, the sorting may be performed in a descending or ascending order.

The plurality of groups may be divided in a common centroid layout.

DESCRIPTION OF SPECIFIC EMBODIMENTS

Hereinafter, a digital analog converter and a method for calibrating current sources thereof in accordance with an embodiment of the present invention will be described in detail with reference to the accompanying drawings. The drawings are not necessarily to scale and in some instances, proportions may have been exaggerated in order to clearly illustrate features of the embodiments. Furthermore, terms to be described below have been defined by considering functions in embodiments of the present invention, and may be defined differently depending on a user or operator's intention or practice. Therefore, the definitions of such terms are based on the descriptions of the entire present specification.

Figure 1:
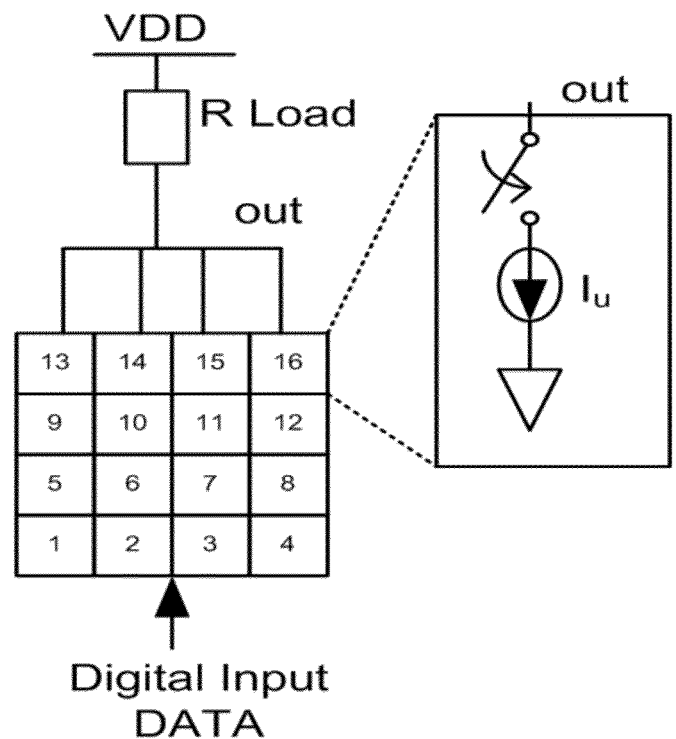
FIG. 1 is a block diagram of a general digital analog converter.
Figure 2:
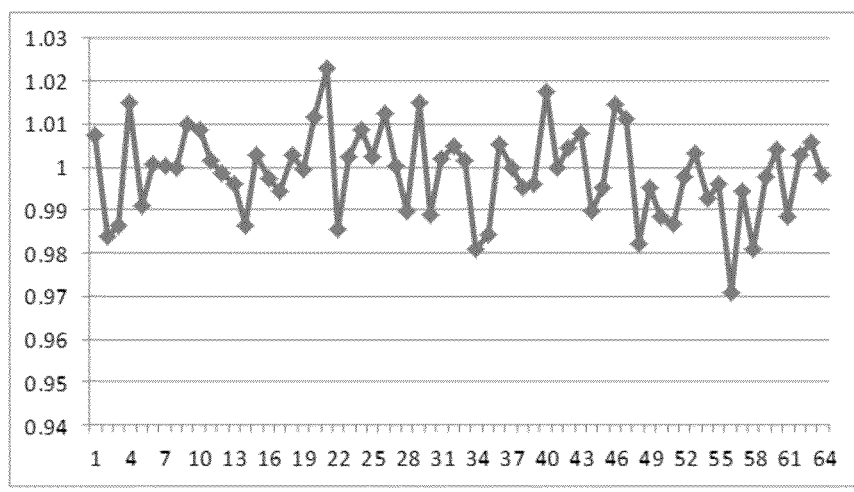
FIG. 2 is a graph showing current magnitudes based on imperfections of a semiconductor process and nonideal characteristics of a semiconductor element.
Figure 3:
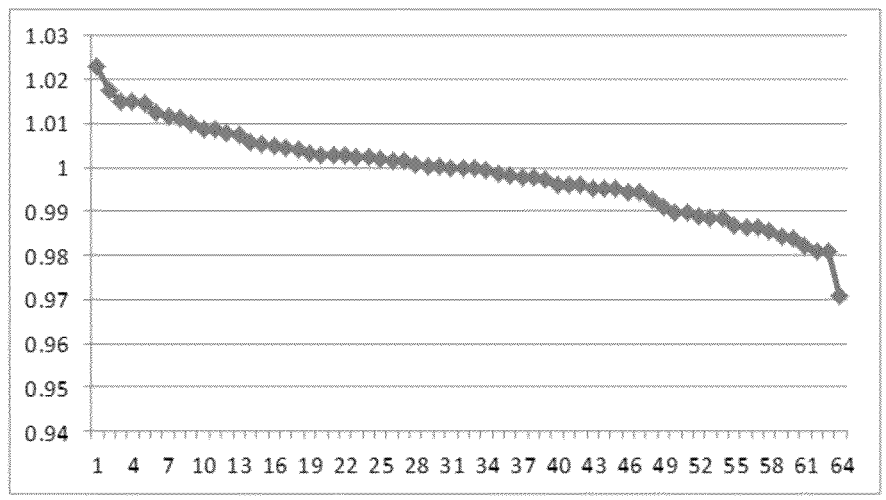
FIG. 3 is a graph showing that current sources of FIG. 2 are sorted according to the current magnitudes thereof.
Figure 4:
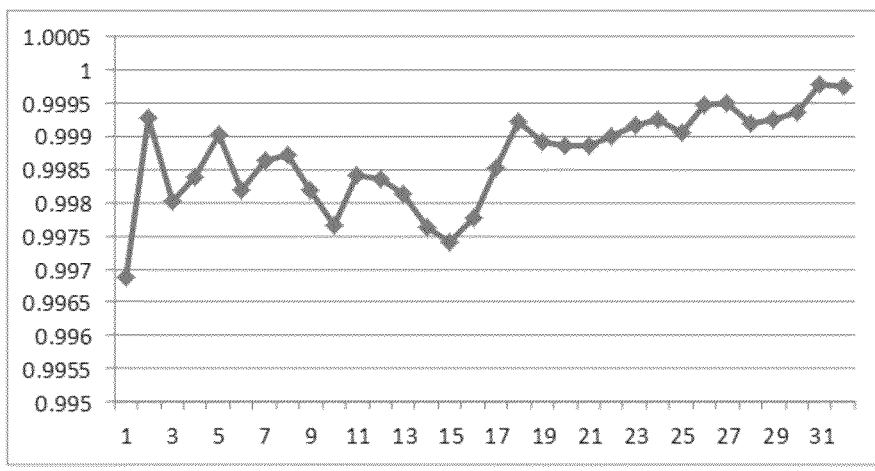
FIG. 4 is a graph showing values obtained by bisecting the sums of current magnitudes of the sorted current source pairs in FIG. 3.

FIG. 3 is a graph showing that the current sources of FIG. 2 are sorted according to the current magnitudes thereof. FIG. 4 is a graph showing values obtained by bisecting the sums of current magnitudes of the sorted current source pairs in FIG. 3.

In general, the magnitudes of current sources exhibit a Gaussian distribution, when statistically analyzed. That is, the magnitudes of current sources exhibit a maximum distribution around an average value and have a bell shape as they becomes distant from the average value, and the distribution curve falls. Since the distribution curve is symmetrical about the average value, the sum of current sources of samples at a predetermined value in the left and right sides from the average value approaches the double of the average value.

FIG. 3 is a graph showing that 64 current sources having a Gaussian distribution in which the magnitudes of the current sources are irregular due to imperfections of a semiconductor process and nonideal characteristics of a semiconductor element are sorted according to a normalized current magnitude.

That is, the magnitudes are sorted from the largest value to the lowest value so as to be symmetrical left and right about the average value. The sorted magnitudes are added symmetrically left and right about the average value, and then bisected. The resultant values approach the average value of the current magnitudes of the current sources.

As shown in FIG. 4, it can be seen that the values obtained by bisecting the sums of the current magnitudes of the sorted current source pairs (1 and 64), (2 and 63), ..., (32 and 33) in FIG. 3 approach the current average value.

Comparing FIG. 2 with FIG. 4, it can be seen that errors from the average value are very small in FIG. 4. That is, comparing normalized output current values, the output current values of the current sources in FIG. 2 range from 0.97 to 1.023, but the output current values of the current sources in FIG. 4 range from 0.997 to 0.9997.

Therefore, in this embodiment, the current sources are sorted according to the current magnitudes thereof, and a mapping table is corrected to map a digital input values of a digital analog converter onto a current source, thereby calibrating the current source.

Figure 5:
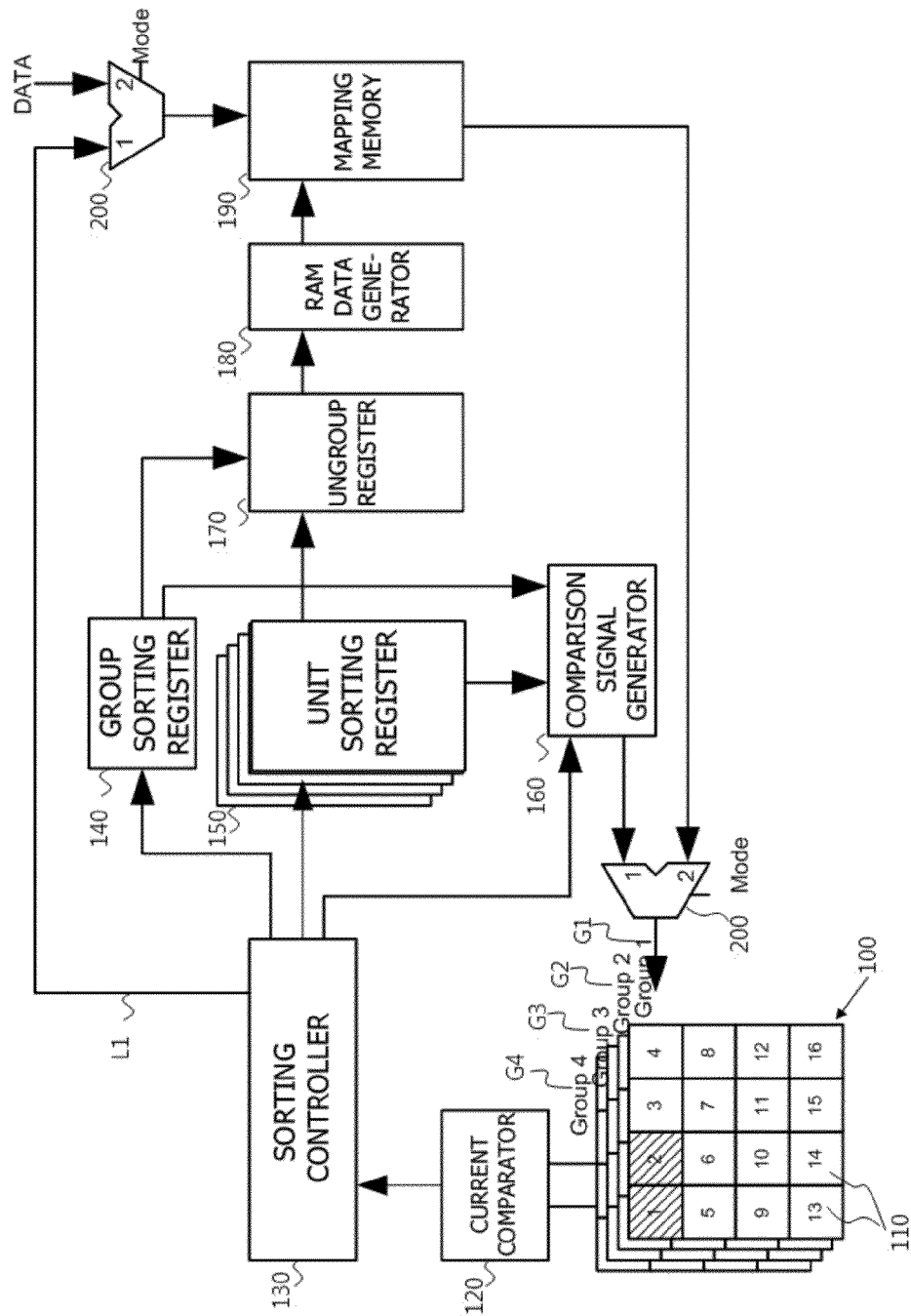
FIG. 5 is a block diagram of a digital analog converter having a calibration function in accordance with an embodiment of the present invention.

FIG. 5 is a block diagram of a digital analog converter having a calibration function in accordance with an embodiment of the present invention.

Referring to FIG. 5, the digital analog converter having a calibration function in accordance with the embodiment of the present invention includes a plurality of current sources and a calibration unit. The calibration unit is configured to sort index values for identifying the plurality of current sources according to the current magnitudes of the current sources in the digital analog converter which outputs currents having different magnitudes with respect to a digital input value according to a mapping table, couple two current sources which are symmetrical left and right about the center of the sorted index values, and map the current source pairs into a mapping table.

At this time, the calibration unit includes a current comparator 120, a group sorting register 140, a unit sorting register 160, an ungroup register 170, a RAM data generator 180, a mapping memory 190, a comparison signal generator 160, and a sorting controller 130.

The current comparator 120 is configured to receive the addresses of two current sources from the comparison signal generator 160 and compare currents of the two current sources. Alternatively, the current comparator 120 is configured to receive the addresses of two current groups and compare currents of the two current groups.

The group sorting register 140 is configured to store the addresses of groups which are sorted according to the current magnitudes of grouped current sources 110. For example, the group sorting register 140 may store the addresses of four groups G1 to G4 according to the order of the entire current magnitudes of the respective groups.

The unit sorting register 160 is configured to store addresses which are sorted according to the current magnitudes of current sources 110 within each group. For example, the unit sorting register 160 may sequentially store the addresses of 16 current sources 110 belonging to a group x (x=1, 2, 3, or 4) according to the current magnitudes of the current sources 110.

The ungroup register 170 is configured to receive the addresses from the group sorting register 140 and the unit sorting register 160, ungroup the grouped addresses according to the current magnitudes of the current sources, and store the ungrouped addresses. That is, the ungroup register 170 stores the addresses from the largest current source of the largest current source group to the smallest current source of the smallest current source group. The final information obtained by sorting the current sources is stored in the ungroup register 170. At this time, the ungroup register 170 may store the information in a descending order.

The RAM data generator 180 is configured to generate a mapping table to store in the mapping memory 190.

The mapping memory 190 is configured to store the mapping table generated by the RAM data generator 180 and output an output signal to switch a current source according to an input of external data.

The comparison signal generator 160 is configured to generate a control signal for selecting which current sources or groups to compare, when comparing current sources or groups.

The sorting controller 130 is configured to receive an output of the current comparator 120 and sort the addresses of the current sources 110 according to the current magnitudes of the current sources 110. The sorted addresses are stored in the group sorting register 140 and the unit sorting register 150. Furthermore, the sorting controller 130 controls the comparison signal generator 160 and outputs the address of the mapping memory 190 when storing the mapping table in the mapping memory 190.

Furthermore, after storing the mapping table in the mapping memory 190 through the calibration operation, the digital analog converter 100 may consider that the calibration operation has been completed, and then switch to a DAC mode for performing a unique function of the digital analog converter 100. For this operation, the digital analog converter 100 may further include a multiplexer 200.

The multiplexer 200 is configured to select one of the calibration mode and the DAC mode. When a number '1' is selected by an input selection bit Mode, the digital analog converter 100 operates in the calibration mode, and when a number '2' is selected, the digital analog converter 100 operates in the DAC mode. The DAC mode refers to a mode in which the digital analog converter 100 actually outputs an analog current value according to a digital input value.

Figure 6:
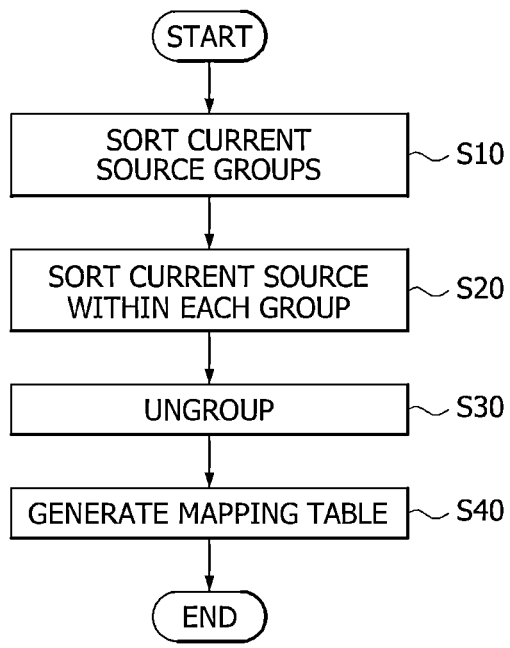
FIG. 6 is a flow chart explaining a method for calibrating current sources of a digital analog converter in accordance with another embodiment of the present invention.
Figure 7:
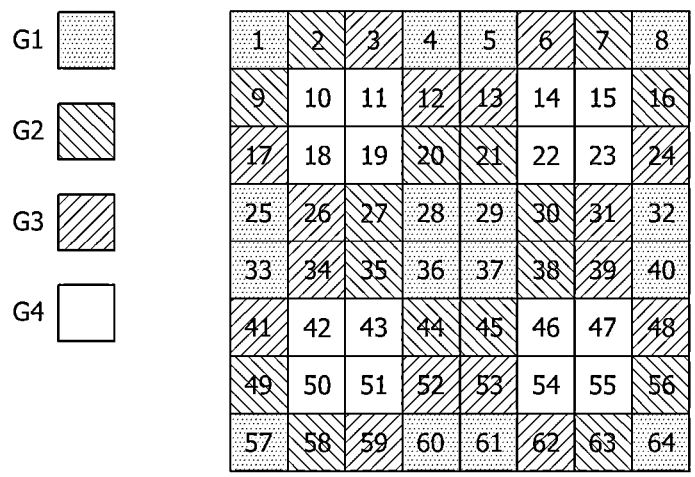
FIG. 7 is a diagram showing an example in which current sources of the digital analog converter in accordance with the embodiment of the present invention are divided into groups.

FIG. 6 is a flow chart explaining a method for calibrating current sources of a digital analog converter in accordance with another embodiment of the present invention. FIG. 7 is a diagram showing an example in which current sources of the digital analog converter in accordance with the embodiment of the present invention are divided into groups. FIGS. 8A to 8D are diagrams explaining a sorting algorithm and a mapping table generation method based on the method for calibrating current sources of the digital analog converter in accordance with the embodiment of the present invention.

Referring to FIG. 6, a plurality of current sources are divided into groups, and the sums of the current magnitudes of the respective groups are compared to sort the groups according to the sums at step S10.

In this embodiment, the current sources 110 are divided into four groups G1 to G4, as shown in FIG. 5. Referring to FIG. 7, the groups may be arranged in a common centroid layout to prevent an imbalance in magnitude between the respective groups, which is caused by a gradation effect of semiconductor device characteristics.

More specifically, sorting the current source groups is performed as follows. The current comparator 120 compares the current magnitude of the entire current sources of the group G1 with the current magnitude of the entire current sources of the group G2, for example, and the comparison result is stored in the group sorting register 140.

In such a process, when the comparison signal generator 160 selects a comparison target of the next current source group by referring to the current state of the group sorting register 140, four current source groups are sorted through 16 (4*4) comparisons by a bubble sorting algorithm.

Then, the current sources 110 of the respective groups G1 to G4 are sorted according to the current magnitudes of the current sources 110 through the same comparison process as that of the current source groups G1 to G4, at step S20.

The groups G1 to G4 and the current sources within the respective groups G1 and G4 are ungrouped at step S30.

For example, it may be assumed that a current source group is represented by Gn (n=1, 2, 3, or 4), the order of the current magnitudes of the groups G1 to G4 is set to G1>G2>G3>G4, a current source within the group Gn is represented by Gn_Im (m=1, 2, 3, . . . , or 16), and the order of the current magnitudes of the current sources is set to Gn_I1>Gn_I2> . . . >Gn_I16. In this case, the ungroup register 170 stores the addresses of the current sources in the order of G1_I1, G2_I1, G3_I1, G4_I1, G1_I2, G2_I2, G3_I2, G4_I2, . . . , G4_I16.

Such a sorting process will be described in more detail with reference to FIGS. 8A to 8D.

Figure 8:
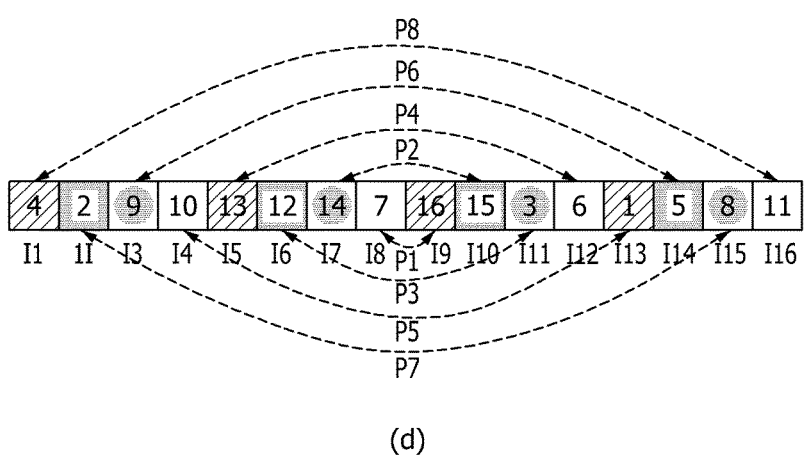
FIGS. 8A to 8D are diagrams explaining a sorting algorithm and a mapping table generation method based on the method for calibrating current sources of the digital analog converter in accordance with the embodiment of the present invention.

First, 16 current sources are grouped in a common centroid layout as shown in FIG. 8A. Then, as shown in FIG. 8B, four groups G1 to G4 are arranged according to the entire current magnitudes of the respective groups G1 to G4, by the group sorting. The current magnitude of the group G3 is larger than that of the group G4, the current magnitude of the group G2 is larger than that of the group G3, and the current magnitude of the group G1 is larger than that of the group G2.

Then, as shown in FIG. 8C, four current sources existing in each of the groups G1 to G4 are sorted according to the current magnitudes of the respective current sources.

Referring to FIG. 8D, the current sources sorted in FIG. 8C are ungrouped and arranged in a line. That is, current sources having the largest current magnitude in the respective groups are sequentially selected from the group G1 to the group G4 and arranged one by one.

When such a process is performed, two current sources which are symmetrical about a pair of seventh and 16th current sources may be paired as shown in FIG. 8D. The current source pairs are represented by P1 to P8.

Each of the current source pairs P1 to P8 may output a current approximate to a current value corresponding to the double of the current average of the entire current sources.

Therefore, a digital analog input value of the digital analog converter may be mapped onto each of the current source pairs P1 to P8.

For example, when the digital input value of the digital analog converter is 0, current may be outputted from the current source pair P1. Similarly, when the digital input value of the digital analog converter is 1, current may be outputted from the current source pairs P1 and P2. That is, when the digital input value of the digital analog converter is k, current may be outputted from current source pair P1 and P(k+1) where k is 0, 1, 2, . . . , 7.

When the sorting is completed in such a manner, the RAM data generator 180 couples the current source pairs such that they are symmetrical about the center index value of the data sorted by the ungroup register 170, generate a mapping table for inputs of external digital data, and stores the generated mapping table in the mapping memory 190, at step S40.

As such, the calibration mode and the DAC mode may be selected by the multiplexer 200 shown in FIG. 5, in order to calibrate the current sources of the digital analog converter.

In the calibration mode, the switch of the multiplexer 200 is connected to the number 1 to calibrate the current sources through the above-described process. In the DAC mode, the switch of the multiplexer 200 is connected to the number 2 to convert digital data into analog data. At this time, the current sources 110 are activated by the mapping table stored in the mapping memory 190.

In accordance with the embodiment of the present invention, most of the circuits for the calibration of the digital analog converter may be digitalized to reduce the area of the integrated circuit, and the use of the analog circuits may be minimized to prevent the performance degradation caused by nonideal characteristics of the analog circuits. Furthermore, it is possible to effectively calibrate the mismatching characteristic of the current sources.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A digital analog converter that output currents having different magnitudes for a digital input value according to a mapping table, comprising:
    a plurality of current sources; and
    a calibration unit configured to sort index values for identifying the plurality of current sources according to current magnitudes of the current sources, couple each two current sources which are symmetrical left and right about the center of the sorted index values, and map the current source pairs into a mapping table.

2. The digital analog converter of claim 1, wherein the calibration unit comprises:
    a current comparator configured to compare the current magnitudes of the plurality of current sources;
    a group sorting register configured to store addresses of a plurality of sorted groups;
    a unit sorting register configured to store address of a plurality of current sources sorted in each of the groups;
    an ungroup register configured to receive addresses from the group sorting register and the unit sorting register, ungroup the grouped addresses according to the current magnitudes of the current sources, and store the ungrouped addresses;
    a RAM data generator configured to generate a mapping table for mapping the plurality of current sources onto digital input values;
    a mapping memory configured to store the mapping table;
    a comparison signal generator configured to generate a control signal for selecting current sources which are to be compared when the plurality of current sources are compared; and
    a sorting controller configured to receive an output of the current comparator, sort the addresses of the current sources according to the current magnitudes of the current sources, store the sorting result in the group sorting register, the unit sorting register and the ungroup register, and control the comparison signal generator to store the mapping table in the mapping memory.

3. The digital analog converter of claim 1, further comprising a multiplexer configured to select one of a calibration mode for selecting an operation of the calibration unit and a DAC mode for outputting a current for the digital input value according to the mapping table.

4. A method for calibrating current sources of a digital analog converter, comprising:
    sorting index values for identifying a plurality of current sources according to current magnitudes of the current sources; and
    coupling each two current sources which are symmetrical left and right about the center of the sorted index values, and mapping the current source pairs into a mapping table.

5. The method of claim 4, wherein, in the step of sorting the index values, the index values are sorted in a descending or ascending order according to the current magnitudes of the current sources.

6. The method of claim 4, wherein the step of sorting the index values comprises:
    dividing the plurality of current sources into a plurality of groups, and sorting the plurality of groups according to the sum of current magnitudes of current sources included in each of the groups;
    sorting the plurality of current sources included in each of the groups according to the current magnitudes of the current sources; and
    alternately and sequentially arranging the plurality of sorted groups and the sorted current sources in the respective groups according to a sorting order.

7. The method of claim 6, wherein, in the step of sorting the plurality of groups and the step of sorting the plurality of current sources, the sorting is performed in a descending or ascending order.

8. The method of claim 6, wherein the plurality of groups are divided in a common centroid layout.

* * * * *